United States Patent [19]
Siemon et al.

[11] Patent Number: 5,362,254
[45] Date of Patent: Nov. 8, 1994

[54] ELECTRICALLY BALANCED CONNECTOR ASSEMBLY

[75] Inventors: John Siemon, Woodbury; Randy Below, Cheshire, both of Conn.

[73] Assignee: The Siemon Company, Watertown, Conn.

[21] Appl. No.: 121,167

[22] Filed: Sep. 14, 1993

Related U.S. Application Data

[62] Division of Ser. No. 993,480, Dec. 18, 1992, Pat. No. 5,295,869.

[51] Int. Cl.⁵ .................. H01R 13/66; H01R 13/74
[52] U.S. Cl. .................. 439/536; 439/142; 439/491; 439/557
[58] Field of Search .......... 439/76, 535, 536, 540, 439/557, 676, 142, 491; 174/53, 66

[56] References Cited

U.S. PATENT DOCUMENTS

| | | | |
|---|---|---|---|
| D. 179,996 | 4/1957 | Wells et al. | D26/5 |
| D. 179,997 | 4/1957 | Wells et al. | D26/5 |
| D. 212,330 | 10/1968 | Teagno et al. | D26/1 |
| D. 233,729 | 11/1974 | De Forrest | D8/9 |
| D. 240,631 | 7/1976 | Lang et al. | D13/3 |
| D. 248,096 | 6/1978 | Stupay | D13/3 |
| D. 269,426 | 6/1983 | Pyle | D13/3 |
| D. 276,605 | 12/1984 | Neuwirth | D13/24 |
| D. 298,826 | 12/1988 | Nakajo et al. | D13/24 |
| D. 300,739 | 4/1989 | Kikuta | D13/24 |
| D. 306,716 | 3/1990 | Shimirak | D13/24 |
| D. 333,656 | 3/1993 | Bluemel et al. | D13/162 |
| 969,409 | 9/1910 | Russell . | |
| 1,278,339 | 9/1918 | Hastings et al. . | |
| 2,244,937 | 6/1941 | Brainard . | |
| 2,427,349 | 9/1947 | Boynton . | |
| 3,343,041 | 9/1967 | Pistey et al. . | |
| 3,579,046 | 5/1969 | Jordan . | |
| 3,641,472 | 2/1972 | Phillips, Jr. . | |
| 3,662,117 | 5/1972 | Bhatt et al. . | |
| 3,744,009 | 7/1973 | Teagno et al. . | |
| 3,757,028 | 9/1973 | Schlessel . | |
| 3,892,925 | 7/1975 | Fisk et al. . | |
| 4,027,937 | 6/1977 | Norden . | |
| 4,049,227 | 9/1977 | Georgopulos . | |
| 4,053,719 | 10/1977 | Debortoli et al. . | |
| 4,144,509 | 3/1979 | Boutros . | |
| 4,241,974 | 12/1980 | Hardesty . | |
| 4,489,419 | 12/1984 | Wang . | |
| 4,600,256 | 7/1986 | Anttila . | |

(List continued on next page.)

FOREIGN PATENT DOCUMENTS

| | | |
|---|---|---|
| 0279405 | 2/1988 | European Pat. Off. . |
| 678914 | 7/1939 | Germany . |
| 3605063 | 1/1987 | Germany . |
| 1-281687 | 11/1989 | Japan . |
| WO92/04793 | 3/1992 | WIPO . |

OTHER PUBLICATIONS

CEKAN Advertising Literature–2 pages issued 1991.
Ortronics Open System Architecture Booklet, Product Guide Issue 4 1993–1994.

(List continued on next page.)

*Primary Examiner*—Neil Abrams
*Attorney, Agent, or Firm*—Fishman, Dionne & Cantor

[57] ABSTRACT

An electrically balanced connector assembly is presented. The assembly comprises a printed circuit board including integrally defined capacitive elements designed to compensate for reactive imbalance of electrical components connected thereto. A pair of wire termination blocks mounted to a first side of the circuit board are connected by circuitry on the circuit board to a corresponding pair of modular jacks mounted to a second side of the circuit board. The capacitive elements are connected between selected leads of the modular jacks and the wire termination blocks by the circuitry. The circuit board assembly is mounted in a panel yoke which includes a pair of apertures for allowing access to the modular jacks aligned therein. The apertures and circuit board assembly are orientated to allow connecting modular cords to gravity feed into and from the modular jacks. The panel yoke includes means for snaplockedly securing the panel yoke to a panel or a wall plate.

31 Claims, 8 Drawing Sheets

U.S. PATENT DOCUMENTS

| | | |
|---|---|---|
| 4,636,918 | 1/1987 | Jodoin . |
| 4,643,509 | 2/1987 | Hollyday et al. . |
| 4,657,323 | 4/1987 | Erbe . |
| 4,668,041 | 5/1987 | Lakomski et al. . |
| 4,669,802 | 6/1987 | Schaffer . |
| 4,676,576 | 6/1987 | Feldberg et al. . |
| 4,678,251 | 7/1987 | Willard . |
| 4,682,129 | 7/1987 | Bakermans et al. . |
| 4,690,479 | 9/1987 | Hollyday et al. . |
| 4,695,115 | 9/1987 | Talend . |
| 4,701,135 | 10/1987 | Volk et al. . |
| 4,714,440 | 12/1987 | Hutchins . |
| 4,717,358 | 1/1988 | Chaundy ............................ 439/557 |
| 4,725,249 | 2/1988 | Blackwood et al. . |
| 4,726,776 | 2/1988 | Billman et al. . |
| 4,726,790 | 2/1988 | Hadjis . |
| 4,747,020 | 5/1988 | Brickley et al. . |
| 4,756,695 | 7/1988 | Lane et al. . |
| 4,781,624 | 11/1988 | Shepherd . |
| 4,791,391 | 12/1988 | Linnell et al. . |
| 4,799,901 | 1/1989 | Pirc . |
| 4,813,071 | 3/1989 | De Luca . |
| 4,815,127 | 3/1989 | Sato et al. . |
| 4,820,192 | 4/1989 | Denkmann et al. . |
| 4,824,383 | 4/1989 | Lemke . |
| 4,853,659 | 8/1989 | Kling . |
| 4,865,564 | 9/1989 | Denkmann et al. . |
| 4,869,682 | 9/1989 | Volk et al. . |
| 4,871,316 | 10/1989 | Herrell et al. . |
| 4,873,600 | 10/1989 | Vogele . |
| 4,874,904 | 10/1989 | DeSanti . |
| 4,875,205 | 10/1989 | Hugng . |
| 4,875,875 | 10/1989 | Archer et al. . |
| 4,878,847 | 11/1989 | Rutledge . |
| 4,878,848 | 11/1989 | Ingalsbe . |
| 4,883,432 | 11/1989 | Reed . |
| 4,905,275 | 2/1990 | Meyerhoefer et al. . |
| 4,909,757 | 3/1990 | Reed ................................. 439/532 |
| 4,912,452 | 3/1990 | Koleyni . |
| 4,912,552 | 3/1990 | Allison, III et al. . |
| 4,929,196 | 5/1990 | Ponn et al. . |
| 4,930,200 | 6/1990 | Brush, Jr. et al. . |
| 4,931,754 | 6/1990 | Moussie . |
| 4,932,892 | 6/1990 | Hatch . |
| 4,939,624 | 7/1990 | August et al. . |
| 4,950,840 | 8/1990 | Zetena . |
| 4,953,206 | 8/1990 | Friesen et al. . |
| 4,958,262 | 9/1990 | Wilkie, Jr. . |
| 4,975,078 | 12/1990 | Stroede et al. . |
| 4,986,779 | 1/1991 | Ferrill et al. . |
| 4,992,061 | 2/1991 | Brush, Jr. et al. . |
| 5,029,270 | 7/1991 | Shiraishi et al. . |
| 5,041,018 | 8/1991 | Arnett . |
| 5,046,968 | 9/1991 | Baur et al. . |
| 5,061,209 | 10/1991 | Bolick, Jr. et al. . |
| 5,068,631 | 11/1991 | Vince . |
| 5,069,641 | 12/1991 | Sakamoto et al. . |
| 5,074,801 | 12/1991 | Siemon . |
| 5,082,457 | 1/1992 | Wallscheidt et al. . |
| 5,088,939 | 2/1992 | Shepherd . |
| 5,091,826 | 2/1992 | Arnett et al. . |
| 5,093,879 | 3/1992 | Bregman et al. . |
| 5,124,506 | 6/1992 | Briggs et al. ......................... 174/67 |
| 5,125,852 | 6/1992 | Archer . |
| 5,139,442 | 8/1992 | Sakamoto et al. . |
| 5,145,401 | 9/1992 | Archer . |
| 5,145,413 | 9/1992 | Okamoto et al. . |
| 5,149,277 | 9/1992 | LeMaster . |
| 5,153,988 | 10/1992 | Mattis et al. . |
| 5,177,782 | 1/1993 | Henderson et al. . |
| 5,178,554 | 1/1993 | Siemon et al. ...................... 439/188 |
| 5,186,647 | 2/1993 | Denkmann et al. . |
| 5,192,230 | 3/1993 | Gabany et al. . |
| 5,228,869 | 7/1993 | Below . |
| 5,238,427 | 8/1993 | Fry et al. . |
| 5,244,417 | 9/1993 | Perretta et al. . |
| 5,290,175 | 3/1994 | Robinson et al. .................. 439/535 |

OTHER PUBLICATIONS

IBM To Market AT&T Cabling System–Roberta Paul and Toni DeCesare, Sep. 30, Phoenix, Ariz.

AT&T News Release–Roni C. DeCesare and Wilma Mathews End–To–End Category 5 Connectivity for Data Networking Applications Available Now From AT&T.

AT&T Systimax Structured Cabling Systems.

Northern Telecom–The Plus Product Line.

Northern Telecom–BIX Patch Panel Plus.

Northern Telecom–BIX IDC Plus.

Northern Telecom–BIX Rack Mounted Panel Plus.

Northern Telecom–BDN Plus Cable.

Northern Telecom–Modular Cords Plus.

Northern Telecom–BIX DVO Plus.

AMP–EIA Category 5 Wiring System.

AT&T Nework Sys., 1100 Modular Jack Panel–1991.

Ortronics, A Stiking Breakthrough In Category 5 Modular Patching!.

Panduit, Pan–Net Category 5 Network Wiring System.

Superior Modular Products, Inc., 100 Megabit Station Outlets.

OTHER PUBLICATIONS

Fully Category 5 Complaint, The Future Is Now: Mod-Tap High Performance–Jan. 1993.

Porta Systems Corp., If there were a category 6, The Effects of Multiple Connectors–Feb. 1993.

Krone literature, Solutions For Every Application.

Northern Telecom, BIX IDC Distribution Connector, 25-pair QCBIX1A Type–Jul. 1992.

Northern Telecom, BIX Path Panel Wall Mount Cross--Connect System–Jul. 1992.

Northern Telecom, BIX DVO Data/Voice Outlet QNE 3 Type; Jul. 1992.

Northern Telecom, BIX Modular Path Panel Rack Mount, QPBIX Type, Jul. 1992.

Kamal S. Boutros; A New Approach to the Design of EMI Filter Connectors Using Planar Filters; Oct. 1979.

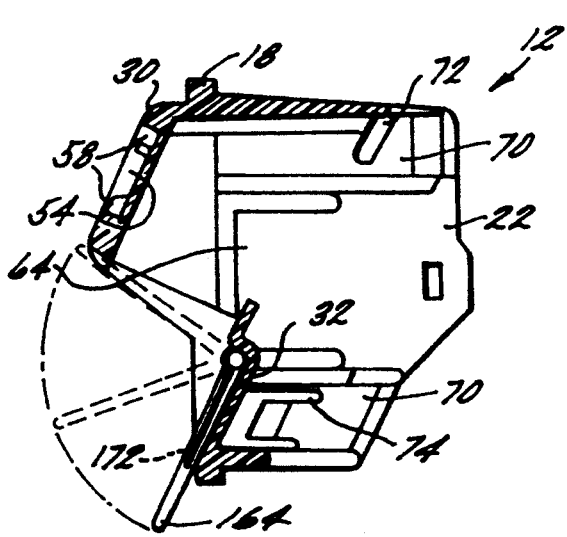
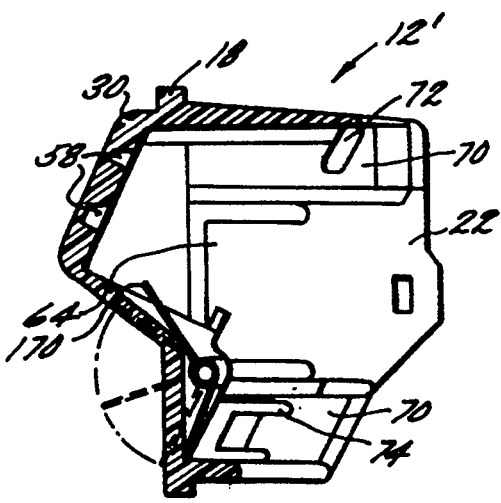
FIG. 6A  FIG. 6B
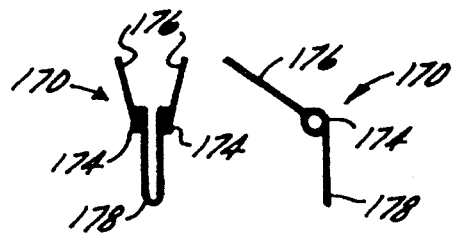
FIG. 7A  FIG. 7B
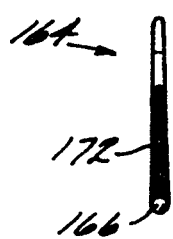
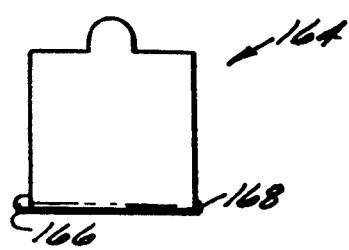
FIG. 8A  FIG. 8B

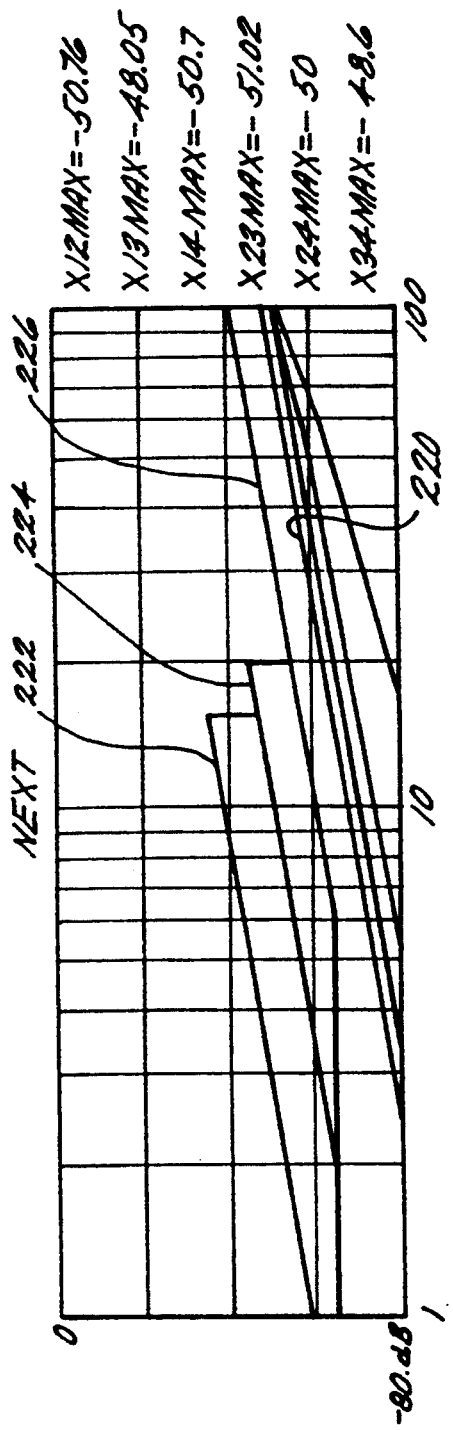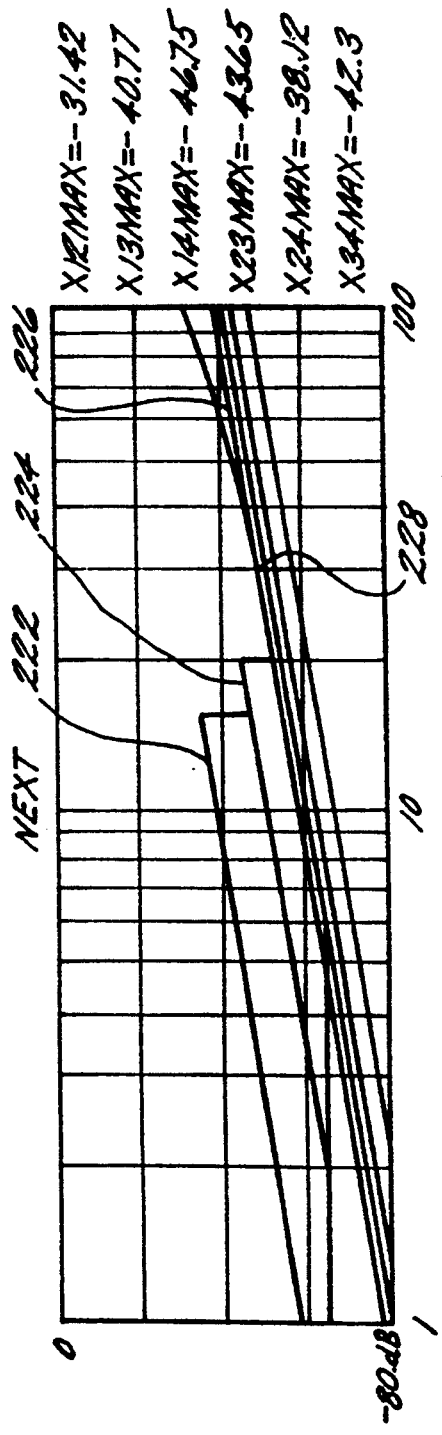

ELECTRICALLY BALANCED CONNECTOR ASSEMBLY

This is a divisional Ser. No. 07/993,480, filed on Dec. 18, 1992, now U.S. Pat. No. 5,295,869.

BACKGROUND OF THE INVENTION

This invention relates to interconnection schemes for use primarily with telecommunication devices. More particularly, this invention relates to an electrically balanced connector assembly.

Communication system and/or network efficiency is directly dependent upon the integrity of the connector scheme employed. Such connector schemes include, for example, standard interfaces for equipment/user access (outlet connector), transmission means (horizontal and backbone cabling), and administration/distribution points (cross-connect and patching facilities). Regardless of the type or capabilities of the transmission media used for an installation, the integrity of the wiring infrastructure is only as good as the performance of the individual components that bind it together.

By way of example, a non-standard connector or pair scheme may require that work area outlets be rewired to accommodate a group move, system change, or an installation with connecting hardware whose installed transmission characteristics are compatible with an existing application but are later found to have inadequate performance when the system is expanded or upgraded to higher transmission rates. Accordingly, connecting hardware without properly qualified design and transmission capabilities, can drain user productivity, compromise system performance and pose a significant barrier to new and emerging applications.

Reliability, connection integrity and durability are also important considerations, since wiring life cycles typically span periods of ten to twenty years. In order to properly address specifications for, and performance of telecommunications connecting hardware, it is preferred to establish a meaningful and accessible point of reference. The primary reference, considered by many to be the international benchmark for commercially based telecommunications components and installations, is standard ANSI/EIA/TIA-568 (TIA-568) Commercial Building Telecommunications Wiring Standard. A supplement Technical Systems Bulletin to TIA-568 is TIA/EIA TSB40 (TSB40), Additional Transmission Specifications for Unshielded Twisted-Pair Connecting Hardware. Among the many aspects of telecommunications wiring covered by these standards are connecting hardware design, reliability and transmission performance. Accordingly, the industry has established a common set of test methods and pass/fail criteria on which performance claims and comparative data may be based.

To determine connecting hardware performance in a data environment, it is preferred to establish test methods and pass/fail criteria that are relevant to a broad range of applications and connector types. Since the relationship between megabits and megahertz depends on the encoding scheme used, performance claims for wiring components that specify bit rates without providing reference to an industry standard or encoding scheme are of little value. Therefore, it is in the interest of both manufacturers and end users to standardize performance information across a wide range of applications. For this reason, application independent standards, such as TIA-568 and TSB40, specify performance criteria in terms of hertz rather than bits. This information may then be applied to determine if requirements for specific applications are complied with. For example, many of the performance requirements in the IEEE 802.3i(10BASE-T) standard are specified in megahertz, and although data is transmitted at 10 Mbps for this application, test "frequencies" are specified in the standard (as high as 15 MHz).

Transmission parameters defined in TSB40 for unshielded twisted pair (UTP) connectors include attenuation and near-end crosstalk (NEXT) and return loss.

Connector attenuation is a measure of the signal power loss through a connector at various frequencies. It is expressed in decibels as a positive, frequency dependent value. The lower the attenuation value, the better the attenuation performance.

Connector crosstalk is a measure of signal coupling from one pair to another within a connector at various frequencies. Since crosstalk coupling is greatest between transmission segments close to the signal source, near-end crosstalk (as opposed to far-end) is generally considered to be the worst case. Although measured values are negative, near-end crosstalk (NEXT) loss is expressed in decibels as a frequency dependent value. The higher the NEXT loss magnitude, the better the crosstalk performance.

Connector return loss is a measure of the degree of impedance matching between the cable and connector. When impedance discontinues exist, signal reflections result. These reflections may be measured and expressed in terms of return loss. This parameter is also expressed in decibels as a frequency dependent value. The higher the return loss magnitude, the better the return loss performance.

Since connecting hardware is generally considered to be electrically short relative to signal wavelengths, return loss requirements are only applied to products that have lengths of internal wiring or circuitry of six inches or more (such as patch panels).

The net effect of these parameters on channel performance may be expressed in signal-to-noise ratio (SNR). For connecting hardware, the parameter that has been found to have the greatest impact on SNR is near-end crosstalk.

Several industry standards specify multiple performance levels of UTP cabling components have been established. For example, Category 3, 4 and 5 cable and connecting hardware are specified in EIA/TIA TSB-36 & TIA/EIA TSB40 respectively. In these specifications, transmission requirements for Category 3 components are specified up to 16 MHz. They will typically support UTP voice and IEEE 802 series data applications with transmission rates up to 10 Mbps, such as 4 Mbps Token Ring and 10BASE-T.

Transmission requirements for Category 4 components are specified up to 20 MHz. They will typically support UTP voice and IEEE 802 series data applications with transmission rates up to 16 Mbps, such as Token Ring.

Transmission requirements for Category 5 components are specified up to 100 MHz. They are expected to support UTP voice as well as emerging video and ANSI X3T9 series data applications with transmission rates up to 100 Mbps, such as 100 Mbps Twisted-Pair Physical Media Dependent (TP-PMD).

In order for a UTP connector to be qualified for a given performance category, it must meet all applicable transmission requirements regardless of design or intended use. The challenge of meeting transmission criteria is compounded by the fact that connector categories apply to worst case performance. For example, a work area outlet that meets Category 5 NEXT requirements for all combinations of pairs except one, which meets Category 3, may only be classified as a Category 3 connector (provided that it meets all other applicable requirements).

It is recognized that there are numerous ways of achieving electrical balance for connecting hardware of the type that is disclosed by the present invention. Several Category 5 type outlet connectors are presently commercially available. These include Systemax SCS Category 5 Products from AT&T Network Systems, DVO Plus and BIX Plus from Northern Telecom and the Category 5 ACO outlet from AMP. This list is only exemplary and is not intended to be a complete listing of Category 5 type products that are presently commercially available. Accordingly, there is a continuing need for improved outlet connectors which meet or exceed Category 5 performance requirements in order to satisfy increasing bandwidth requirements of communication systems and networks.

The Systemax SCS Category 5 outlet from AT&T network systems uses a "cross-over lead" concept which achieves a desired level of crosstalk performance without the use of printed wiring boards or other additional components. This product uses a variation of the well known lead-frame outlet construction that has been in use for many years by numerous companies. Although this approach offers potential cost benefits by minimizing the quantity and types of components in the completed assembly, it is limited in several major respects. First, because of its completely custom design, the multiple outlet configurations that are presently in use in the industry, of which a minimum of twenty-four exist as defined by the T1E1.3 Working Group on Connectors and Wiring Arrangements, cannot be accomplished without the expense of re-tooling each of the individual configurations in order to accommodate their unique interface and connection schemes. Another limitation of the AT&T SCS outlet is that, because the outlet contacts are physically integral to the product's wire termination means, its ability to connect electrical components, such as fuses, in series or parallel with individual circuit elements is not possible. The custom design of this product also makes it necessary to provide it with special tools or other components that are specifically designed to terminate individual UTP conductors, since the connection points are not compatible with tools that are common to the industry or trade.

Because of its printed circuit construction, the Category 5 ACO outlet offered by AMP Incorporated, overcomes some of the limitations listed above for the AT&T product, but is encumbered by several severe limitations of its own. The method used to correct for the electrical imbalance of the outlet connector involves a combination of individual discrete capacitors that are soldered onto the circuit board and capacitive pads that are etched into the top and bottom surfaces of the board itself. These capacitors compensate for the reactive imbalance between wire pairs, which in-turn improves the product's crosstalk performance. The limitation of this approach is that it requires additional expense for the discrete capacitors and for the secondary operations required to locate and solder them into place.

Since telecommunications outlets require two types of connections, there are two types of connectors that must be mounted on the circuit board. One type is the outlet connector that is, directly accessible when the outlet assembly is mounted in a standard electrical box. The other type is comprised of means to connect the outlet to individual wires in order to provide access to the telecommunications network. This second type of component is most often placed behind a faceplate or other physical barrier to conceal and protect the wire connections during normal use. Because one type of connector is intended to be accessible once installed, and the other is not, it is often preferable that they be mounted on opposite sides of the circuit board.

Such opposed-surface mounting provides the benefits physical isolation between the two connection means and is more space efficient, but opposed surface mounting requires two separate soldering operations for prior-art outlets, the second of which must be manual unless the components are all made of special, high-cost materials that are able to withstand the extreme temperatures of vapor-phase soldering. For this reason, the AMP ACO outlet and other known prior-art telecommunications outlets that employ printed circuitry are designed with components that are soldered from the same side of the printed circuit board.

The BIX Plus Category 5 telecommunications outlet offered by Northern Telecom, Inc. also employs printed circuitry to improve the balance between pairs. In order to achieve a higher level of crosstalk performance this product relies on capacitive pads that are etched into opposed sides of the printed board. A significant drawback of this approach is that, in order to add sufficient capacitance to improve performance to achieve Category 5 performance for some circuits, it may be necessary to enlarge the pads to a size that compromises space efficiency and printed circuit board cost.

If the spacing between the pads is reduced by making the printed circuit board thinner, mechanical integrity is reduced and the board may no longer be compatible with off-the-shelf circuit-mounted components that are designed for a standard board thickness. In addition, the use of etched circuit pads has inherent limitations on the accuracy and consistency of their capacitance due to the inherently wide manufacturing tolerances (typically $\pm 10\%$) on circuit board thickness.

The BIX Plus Category 5 outlet shares many of the other limitations of the AMP ACO product. Since all components are mounted on the same side of the circuit board, it has similar limitations with respect to space efficiency and the routing of wires within the electrical box. In addition, because the components are oriented such that they are all accessible from the front, the height of the wire termination connector mandates that a non-standard, high profile outlet connector be used to provide unencumbered access with a modular plug.

It will be appreciated that other methods of balance compensation exist, such as selective parallel runs of circuit traces either in a side-by-side configuration or overlapping traces placed on adjacent layers of a circuit board. It is also possible to vary trace thickness in order to achieve a degree of inductive balance correction between pairs. Yet another method of achieving balance between pairs that employs neither lead-frame or printed circuit construction is to selectively twist wire leads that exit the back of a conventional modular jack outlet. However, each of these methods has its own inherent limitations in terms of repeatability, cost and performance.

A significant physical limitation that is shared by each of the above-described telecommunications outlets is the orientation of the outlet opening. Because the cables that these products are designed to connect-with have high performance characteristics, it is also important that the physical integrity of the cable be preserved to the greatest extent possible. For this reason, TIA specification TSB40 requires that, in spaces with UTP terminations, cable bend radii shall not be less than eight-times the cable diameter. For standard four-pair UTP cable, this requirement translates to a minimum bend radius of not less than 40 millimeters (1.5 inches). The direct outward orientation of the prior-art Category 5 outlets requires that, for nearly all wall mounted applications, the plug cord take an immediate rightangle bend as it exits the outlet. The ever-present effect of gravity naturally causes the bend radius to tighten, which may or may not be compounded by the presence of furniture directly in front of the outlet opening. These factors make it difficult, if not impossible for the prior art Category 5 outlets to prevent the plug cable from violating the bend radius requirements of industry standards. Therefore, the prior art devices are physically unable to consistently provide the level of performance that is required for this type of connector.

Other telecommunications outlets, particularly those that mount directly to a flat surface, as opposed to a recessed electrical box or other enclosure, provide outlet openings that have a substantially perpendicular orientation to the wail. One such outlet is manufactured by Cekan A/S of Denmark. A disadvantage of these products is that they do not offer recessed electrical box mounting and that they do not offer a comparable level of transmission performance.

Prior art connectors that do have the substantially perpendicular orientation such as the one offered by Cekan have an additional limitation. Since they are often mounted on a baseboard, which is directly adjacent to the floor surface, the outlet opening is susceptible to contaminants such as corrosive solvents that may wash into the jack during cleaning. Also, solid debris such as dust, lint and dirt are free to enter and cause damage to the outlet receptacle.

SUMMARY OF THE INVENTION

The above-discussed and other drawbacks and deficiencies of the prior art are overcome or alleviated by the electrically balanced connector assembly of the present invention. In accordance with the present invention, a printed circuit board includes integrally defined capacitive elements designed to improve electrical balance between the pairs in the modular jack and thereby optimize its crosstalk performance. The capacitive elements are provided by means of a novel use of plated through holes that are arranged and interconnected in a grid pattern on the printed circuit board The holes may be sized, spaced and interconnected in various configurations to generate the desired capacitance. This method of tuning capacitive balance between pairs makes use of well known elements of printed circuitry to produce a new desired effect. An extremely repeatable and economical means of adding capacitance to electrical circuits is obtained by the method of the present invention. A pair of wire termination blocks mounted to a first side of the circuit board preferably by solderless means are connected by circuitry on the circuit board to a corresponding pair of modular jacks mounted to a second side of the circuit board. The capacitive elements are connected between selected leads of the modular jacks and the wire termination blocks by the circuitry.

The circuit board is mounted in a panel yoke which includes a pair of apertures for allowing access to the modular jacks aligned therein. The apertures are orientated to allow connecting modular cords to "gravity feed" from the modular jacks. The angular, downward orientation of the outlet connectors allows modular plug cords that are connected therein to "gravity feed" without sharp bending or other contortions that are known to have detrimental effects on transmission performance. This outlet orientation also enhances its ability to accommodate mounting in locations where furniture or other objects are placed directly in front of or in close proximity to the outlet faceplate. Not only does this alleviate sharp cable bending, but it also allows the outlet opening to be accessible for connecting and disconnecting telecommunications plug cords while objects are located directly in front of the outlet face plate. The panel yoke includes means for snaplockedly securing the panel yoke to a panel or wall plate.

The assembly of the present invention provides a connector scheme that meets or exceeds Category 5 transmission requirements as defined in TSB40. Therefore, the assembly of the present invention provides many of the aforementioned advantages for which Category 5 was established.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIGS. 2A-F are views of a panel yoke used in the assembly of FIG. 1 wherein FIG. 2A is a front view thereof, FIG. 2B is an bottom view thereof, FIG. 2C is a side elevational view thereof, FIG. 2D is a rear view thereof, FIG. 2E is a view taken along the line 2E-2E of FIG. 2A and FIG. 2F is a view taken along the line 2F-2F of FIG. 2A;

FIGS. 3A-C are views of a circuit board assembly used in the assembly of FIG. 1 wherein FIG. 3A is a rear view thereof, FIG. 3B is a side elevational view thereof, and FIG. 3C is an end view thereof;

FIGS. 4A-C are views of the circuit board used in the circuit board assembly of FIGS. 3A-C wherein, FIG. 4A is a top view thereof, FIG. 4B is a side view thereof and FIG. 4C is a bottom view thereof;

FIG. 6A is a view taken along line 2E-2E of FIG. 2A in accordance with a preferred embodiment of the present invention;

FIG. 6B is a view taken along line 2F-2F of FIG. 2A in accordance with a preferred embodiment of the present invention;

FIGS. 7A–7B are front and side views respectively of the spring of FIG. 6B;

FIGS. 8A–8B are front and side view respectively of the door of FIG. 6A;

FIGS. 9A–E are view of the circuit board used in the circuit board assembly of FIGS. 3A–C in accordance with an alternate embodiment of the present invention wherein, FIG. 9A is a top view thereof, FIG. 9B is a side view thereof, FIG. 9C is a bottom view thereof, FIG. 9D is a view taken along the line 9D–9D of FIG. 9B, and FIG. 9E is a view taken along the line 9E–9E of FIG. 9B; and FIG. 10A is a plot of NEXT performance of the assembly of the present invention; and FIG. 10B is a plot of NEXT performance of a prior art device.

DESCRIPTION OF THE PREFERRED EMBODIMENT

Figure 1:
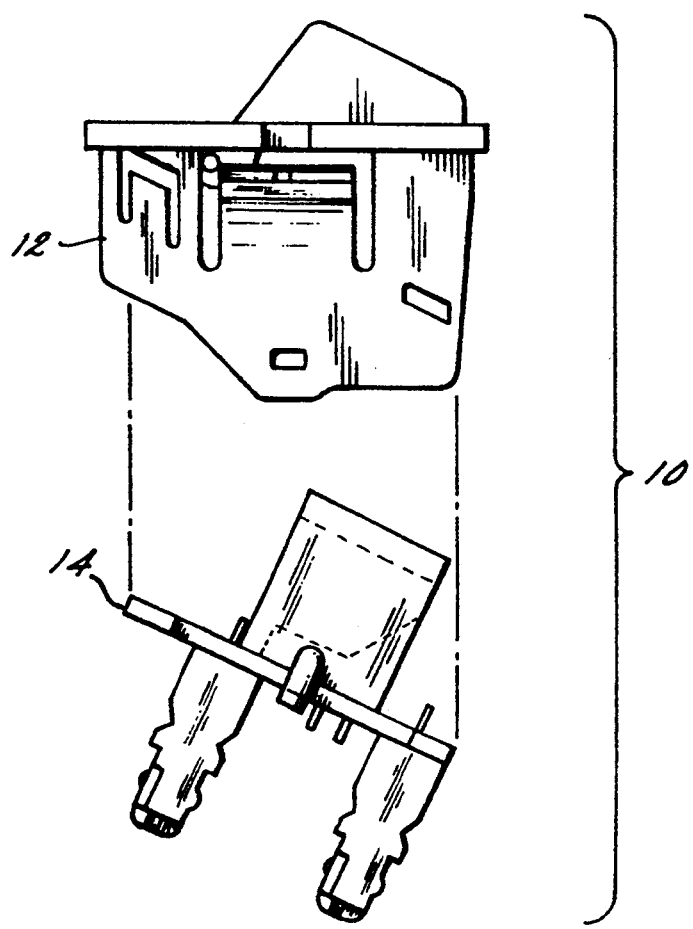
FIG. 1 is an exploded side elevational view of an electrically balanced modular jack assembly in accordance with the present invention.

Referring to FIG. 1 an electrically balanced connector (i.e., modular jack) assembly is shown generally at 10. Assembly 10 comprises a panel yoke 12 having a circuit board assembly 14 inserted therein.

Figure 2A:
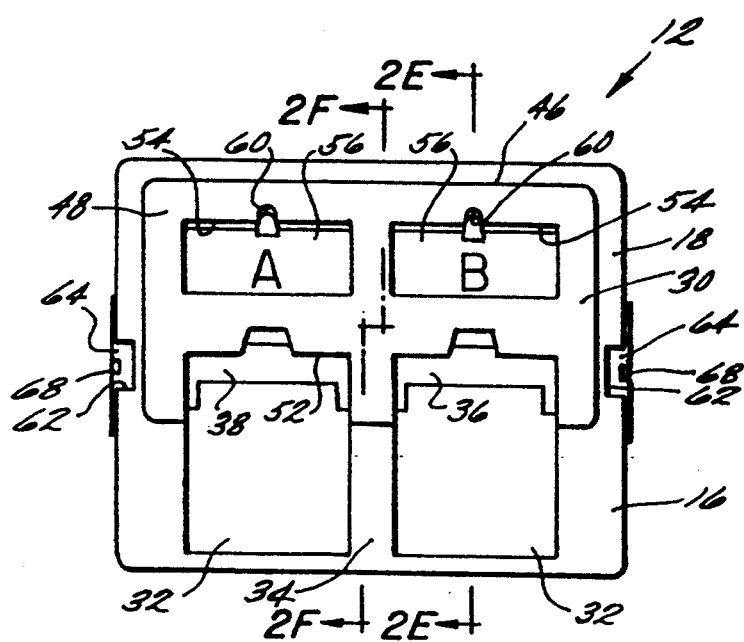
Figure 2B:
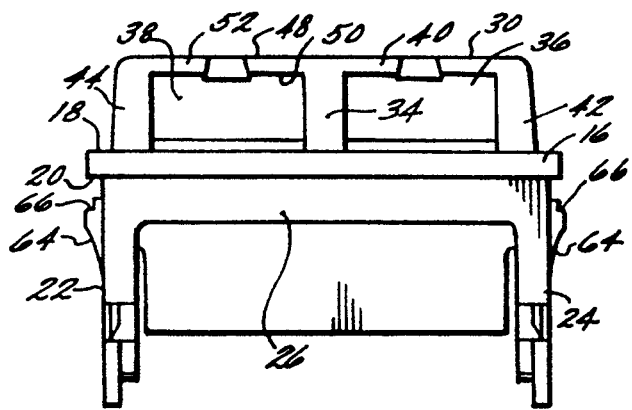
Figure 2C:
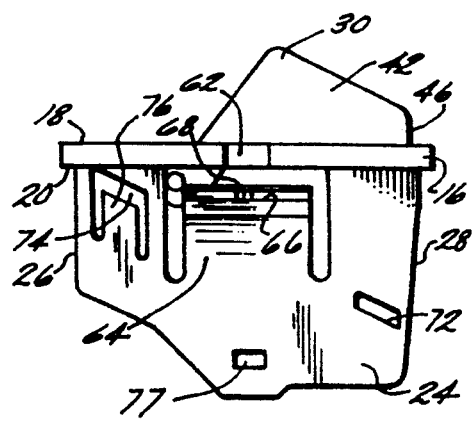
Figure 2D:
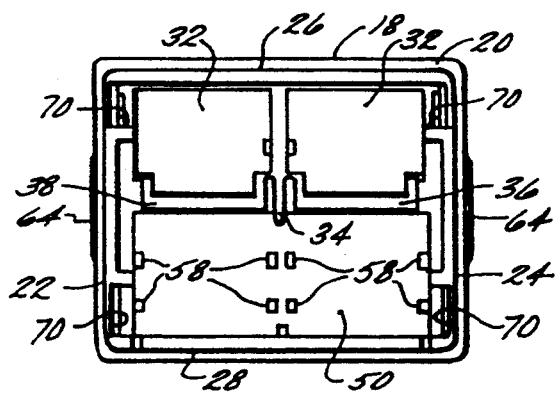
Figure 2E:
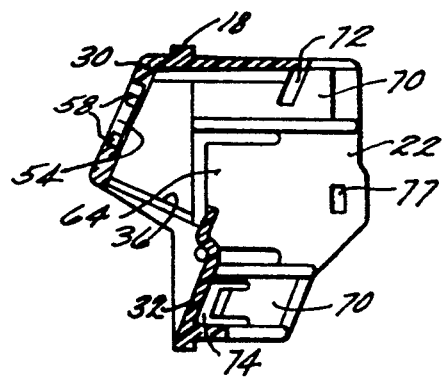
Figure 2F:
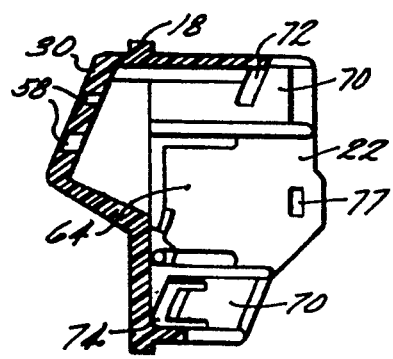

Referring now to FIGS. 2A–F panel yoke 12 is shown. Yoke 12 includes a front cover 16 having opposing surfaces 18, 20, first opposing sides 22, 24 and second opposing sides 26, 28. Cover 16 includes an inclined portion 30, an inclined recess portion 32 and a dividing member 34 which together define apertures 36 and 38. Portion 30 includes a plate 40 angularly displaced upwardly from surface 18 by side members 42, 44 and an end member 46. Plate 40 includes opposing surfaces 48, 50 and edge 52. Recess portion 32 is also angled relative to surface 18 and is complementary to plate 40. Above each aperture 36, 38 on surface 48 is a recess 54 which is receptive to an insert 56 (FIG. 5) for designation and color coding of the telecommunications outlet. An aperture 58 (FIG. 2D) is located at each of the four corners of each recess 54. Apertures 58 are in partial communication with recess 54 and are provided in order to permit snap latching of insert 56 (FIG. 2E). An extension 60 of recess 54 is provided to facilitate removal of insert 56. Insert 56 is more fully described in U.S. Patent application Ser. No. 795,033 filed Nov. 20, 1991, now U.S. Pat. No. 5,228,869 assigned to the assignee hereof and expressly incorporated herein by reference.

A pair of opposed resiliently defeatable cantilevered arms 64 extend forwardly from the back of sides 22 and 24 of yoke 12. Arms 64 each include a retaining edge 66. Arms 64 are urged inwardly when yoke 12 is inserted into an aperture from a front surface of a plate 7 (FIG. 5) and snaps back when yoke 12 is fully inserted. Plate 67 is generally rectangular and includes at least one aperture for insertion of an assembly 10. Cover 16 further includes a pair of channels 62 at opposing sides of cover 16. Yoke 12 may be removed from plate 67 by inserting a rigid member (not shown) between plate 67 and yoke 12 at each channel 62. The member is then further inserted until it rests on edge 66 of each arm 64 and pried inwardly until retaining edges 66 are released from plate 67. Yoke 12 may then be removed from plate 67. Cantilevered arms 64 are more fully described in U.S. Patent application Ser. No. 795,033 (now U.S. Pat. No. 5,228,869).

A pair of guide channels 70 are defined at the interior surface of each side 22 and 24. A pair of retaining slots 72 and 74 through each side 22 and 24 are located within the channels 70. Slot 74 is somewhat "U" shaped so as to define a resilient panel 76.

Yoke 12 also includes eyelets 77 through sides 22 and 24 for securing cabling ties during installation.

Figure 3A:
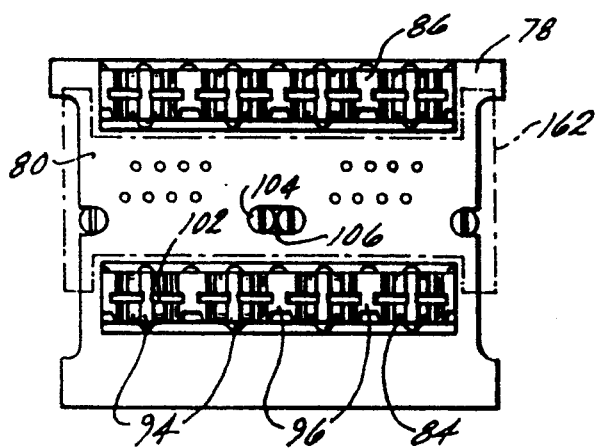
Figure 3B:
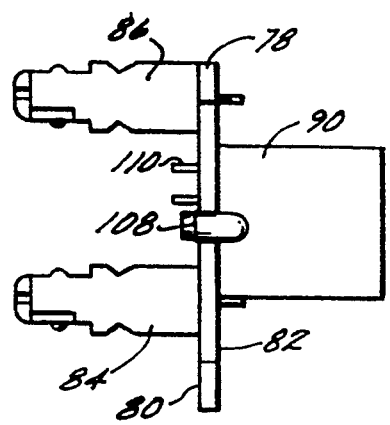
Figure 3C:
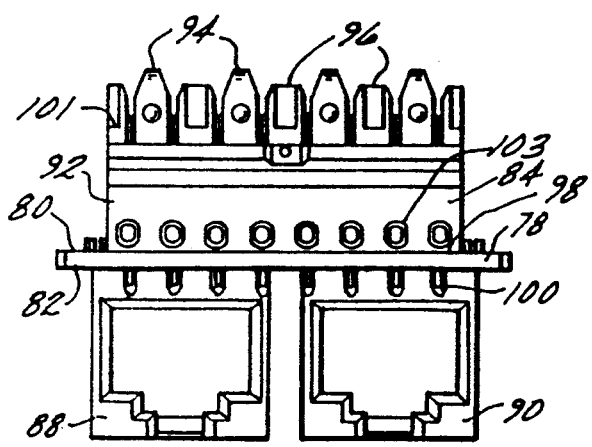

Referring now to FIGS. 3A–C, circuit board assembly 14 is shown. Assembly 14 includes a printed circuit board 78 having opposing surfaces 80, 82. A pair of wire termination blocks 84, 86 are mounted on surface 80 of board 78. A corresponding pair of modular jacks 88, 90 are mounted on surface 82 of board 78.

Modular jacks 88, 90 are secured to circuit board 78 by resilient upright members 104 which are urged into openings 106 of board 78 and are retained therein by shoulders 108. Further jacks 88, 90 include leads 110 which further secure jacks 88, 90 to board 78 and also provide electrical connection thereto. Jacks 88, 90 are, for example, commercially available from Stewart Stamping, AMP Incorporated and other manufacturers of modular connectors.

Termination blocks 84 and 86 are of the same type (e.g., termination blocks disclosed in U.S. Patent application Ser. No. 932,495 filed Aug. 20, 1992, assigned to assignee hereof and expressly incorporated herein by reference), therefore only termination block 84 will be described in detail below. Termination block 84 comprises a one piece molded housing 92. Housing 92 is substantially rectangular in shape and includes a plurality of spaced apart teeth 94 and 96 along the length of its upper surface. Teeth 94 and 96 alternate and are staggered in height to facilitate indexing of a set of conductors in wire strain relief slots. Also, as is conventional with connecting blocks of this type, the teeth include tapered sides to facilitate entry of the wire conductors (not shown).

A lower surface 98 of housing 92 includes a plurality of post or leads 100 extending downwardly therefrom. Tails 100 are of a press-fit configuration, designed to effectuate a permanent, solderless connection with plated through holes in circuit board 78. Press fit tails 100 also act to physically secure block 84 to board 78 and are integral to individual beam contacts 101 positioned within housing 92. Spaced openings 102 through the upper portion of housing 92 and through the staggered teeth 94, 96 form adjacent channels for receiving and positioning the beam contacts 101 during assembly to the printed circuit board. Retention posts 103 physically retain each beam contact to housing 92 before, during and after assembly to the printed circuit board.

Once the modular jacks are soldered into the printed circuit board, termination. As blocks, 84 and 86 are pressed into place. It is preferred that the press-fit tails of blocks 84, 86 allow plated through hole connections to be made from components on both sides of the printed circuit board with only a single soldering operation. This capability enables the module to realize the spacing and other packaging advantages of connectors mounted on two sides of the printed circuit board without the added expense of hand soldering, or requirements for costly, high temperature connector housing materials.

It will be appreciated that, in an alternate embodiment (not shown) it is possible to replace the termination blocks 82, 84 with commercially available termination blocks equipped with solder tails or other connection means (e.g., AT&T Technologies series 110D connectors). It is equally possible to replace the solder-tail modular jacks 88, 90 with alternate connectors that may or may not require soldering to electrically connect to the printed circuit board.

Figure 4A:
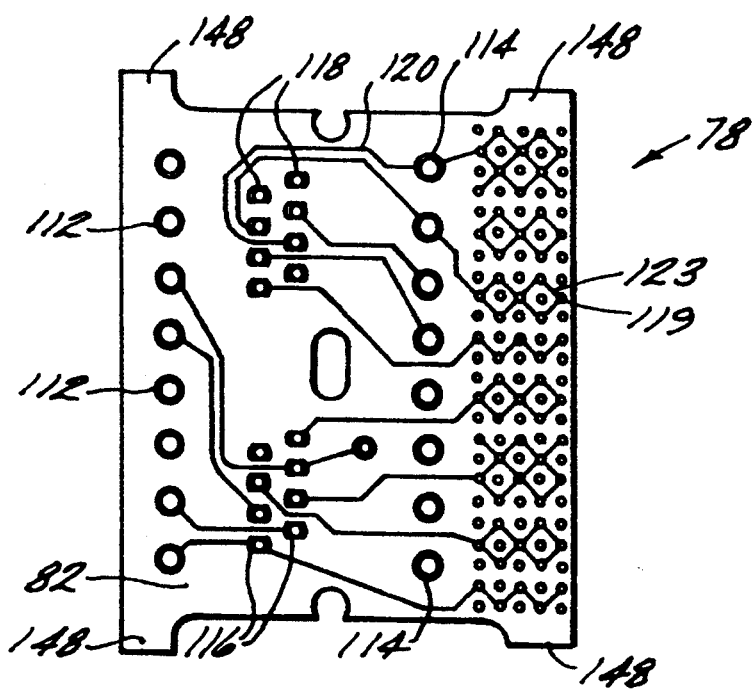
Figure 4B:
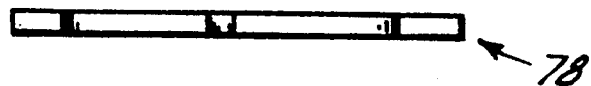
Figure 4C:
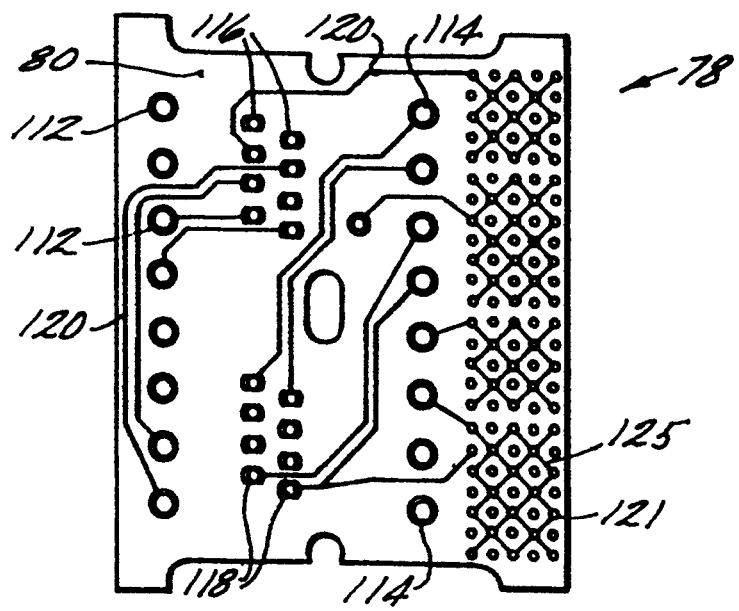

Referring now to FIGS. 4A-C, circuit board 78 is shown. Board 78 is a two-sided printed circuit board having a plurality of vias or feed-through holes therethrough. A first set of pads 112 having feed-through holes accepts block 86, a second set pads 114 having holes accepts block 84, a third set of pads 116 having holes accepts jack 90 and a fourth set of pads 118 having holes accepts jack 88. Surfaces 80 and 82 of board 78 include a plurality of circuit traces 120 interconnecting pads 114 with pads 118 and pads 112 with pads 116 in a predetermined configuration, thereby providing interconnection of block 84 with jack 88 and block 86 with jack 90. The configuration of the traces is determined by the application of the device, and generally conforms with a selected industry standard.

A first side 82 of printed circuit board 78 includes a grid of circuitry 123 connecting to pads 119, having vias or through holes that are interconnected in substantially diagonal patterns which, in turn, are selectively connected to circuit traces 120 in such a way as to introduce shunt (parallel) connections to the individual circuit paths provided between pads 112, 114 and pads 116 and 118 respectively; each of which function as one side of a capacitive element. Likewise, a second side 80 of printed circuit board 78 includes a grid of circuitry 125 connecting to pads 121, having vias or through holes that are also interconnected in substantially diagonal patterns which, in turn, are selectively connected to other circuit traces 120; each of which function as a second side of a capacitive element. It will be appreciated that the first set of interconnected of pads 119 on side 82 of the circuit board and the second set of interconnected of pads 121 on side 80 of the circuit board are not electrically connected, but that they are spatially arranged on each side of the circuit board in such a way as to generate a desired amount of capacitive coupling between the circuit grids on opposing sides 80, 82.

The advantage of using through holes, as opposed to discrete capacitors or capacitive pads to perform the tuning function that is necessary to achieve a desired level of transmission performance are manifold. Because they require no added components or secondary assembly operations, as do discrete capacitors, the capacitive through holes offer inherent advantages with respect to manufacturing cost as well as product reliability. Also, for circuit boards with the thickness needed to allow mounting of standard, off-the-shelf components, the magnitude of capacitance per unit area is much greater than that of overlapping capacitive pads on opposing surfaces. This benefit results from the fact that the capacitive coupling for through holes occurs on multiple planes rather than the unidirectional coupling that is characteristic of parallel pads or plates.

It will be appreciated that in an alternate embodiment (not shown), the diameter and spacing of the through holes may change as required by the physical and electrical constraints of the application or industry standard. Also, the pattern and width of the circuitry that forms grids 123 and 125, and pads 119, 121 may vary according to the requirements of the individual outlet or connector. This method of achieving a controlled amount of capacitive coupling between selected circuit paths of a connector is an important feature of the present invention. They allow reactive imbalance between pairs that is caused by certain outlet wiring schemes and wire connectors to be compensated for, by the printed circuitry and through holes so as to allow a connection device to meet or exceed Category 5 requirements as described hereinbefore.

The benefits of "Category 5" devices are readily appreciated by one of ordinary skill in the art. The most significant being the substantial cost savings in using unshielded twisted pair wire where shielded, co-axial or fiber optic cable has been used in the past due to bandwidth limitations of the UTP.

Circuit board 78 further includes tabs 148 at the four corners thereof. Tabs 148 are guided by channels 70 (FIGS. 2A-F) of yoke 12 when assembly 14 is inserted into yoke 12. A first pair of tabs 148 outwardly urge the upper portion of resilient side walls 22, 24 until they engage slots 72 of yoke 12 and side walls 22, 24 snap back inwardly, while simultaneously the second pair of tabs 148 urge panel 76 outwardly until these tabs are engaged in slots 74 and panel 76 snaps back inwardly, whereby assembly 14 is then secured in yoke 12.

Figure 5:
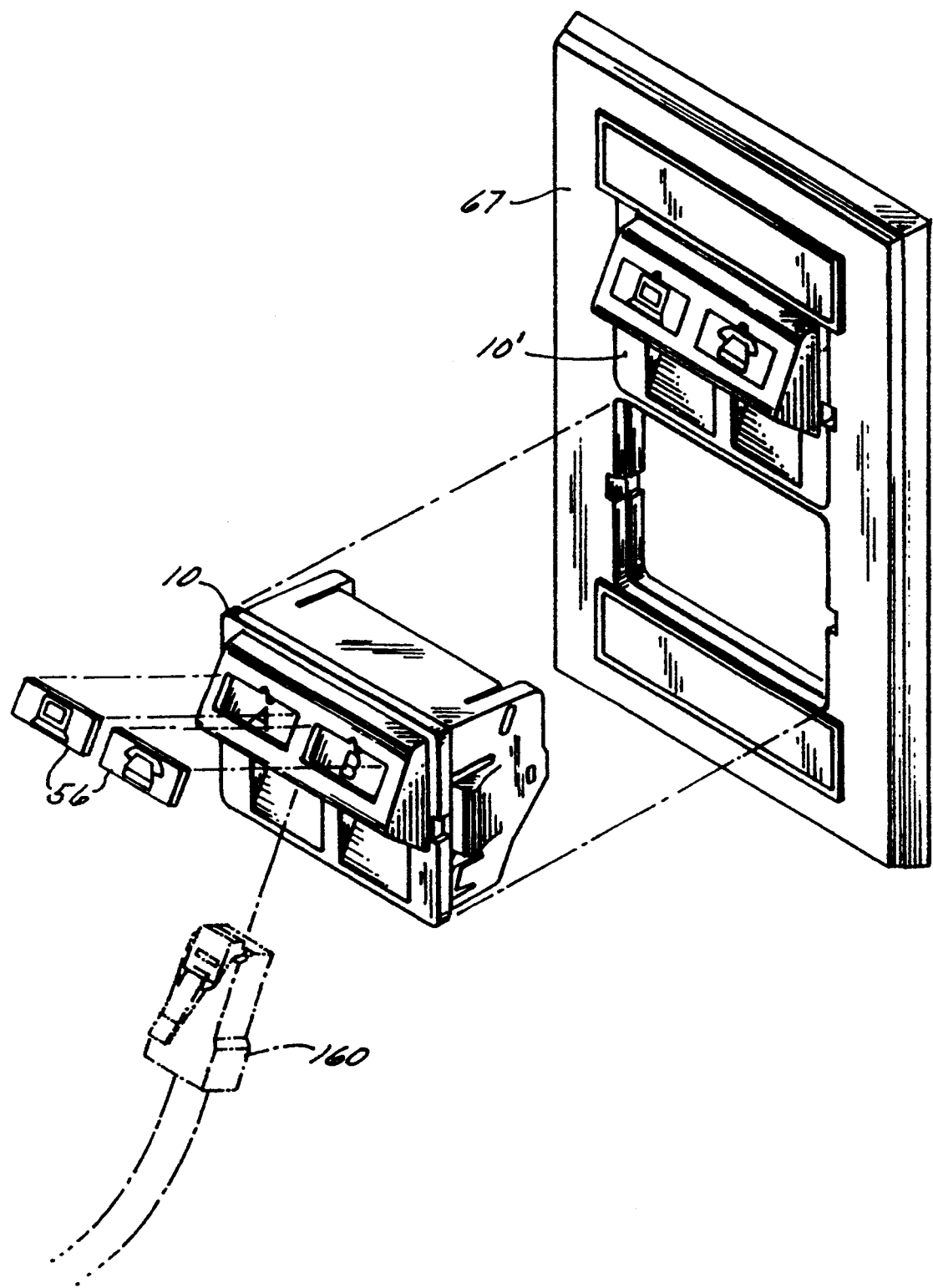
FIG. 5 is a partially exploded front isometric view of a modular jack cover plate assembly having electrically balanced modular jack assemblies installed therein in accordance with the present invention shown with a partial view of a modular connector.
Figure 9A:
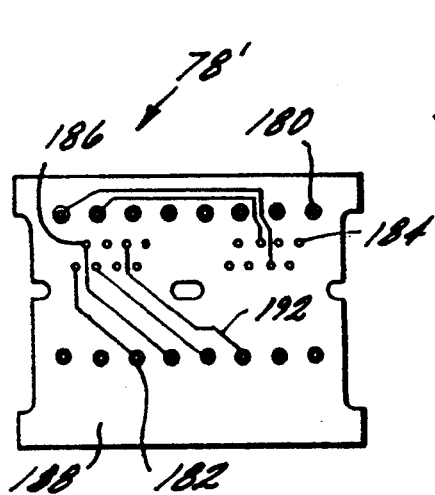
Figure 9B:
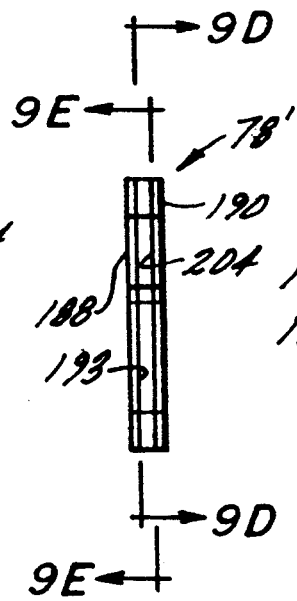
Figure 9C:
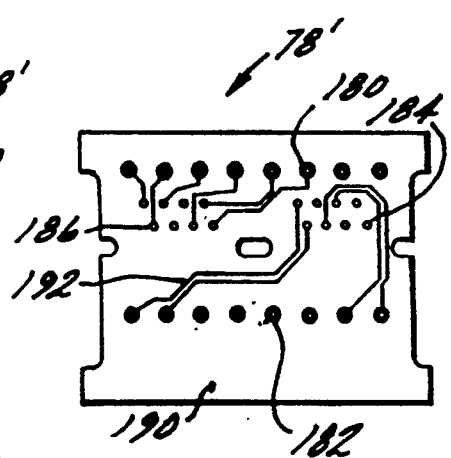
Figure 9D:
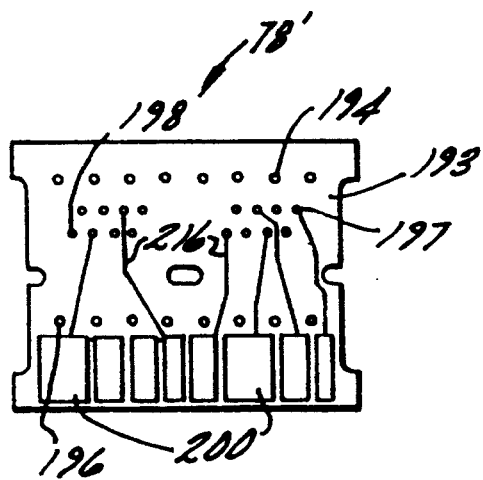
Figure 9E:
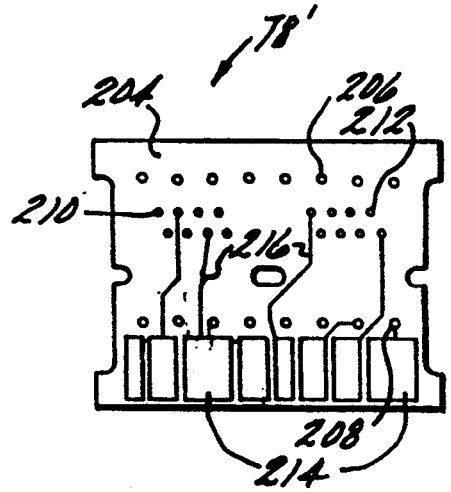

Referring now to FIG. 5, plate 67 is shown with assembly 10 installed therein and assembly 10' prior to installation, wherein assemblies 10 and 10' are of the same type described hereinbefore. FIG. 5 also shows inserts 56 installed in assembly 10 and inserts 56' prior to installation in assembly 10'. Plate 67 and insert 56, 56' have been disclosed in U.S. Patent application No. 795,033.

FIG. 5 also shows a known type modular plug connector 160 (in a phantom) positioned for insertion into one of the jack receptacles in assembly 10'. The orientation of the plug illustrates the benefits of the gravity-feed orientation of the modular jacks in assembly 10'.

An optional rear cover is shown in phantom in FIG. 3A at 162. This cover 162 will protect leads 100 during installation of wire in wire termination blocks 84 and 86. In addition, this cover provides a rear designation surface for use by installation and service personnel.

Referring to FIGS. 6A-B, 7A-B and 8A-B, a preferred embodiment of the panel yoke is shown generally at 12'. Yoke 12' is the same as yoke 12 of FIGS. 2A-F with the exception of covers 164. One cover 164 is pivotably disposed over each aperture 36 and 38. Each cover 164 is generally rectangular and includes posts 166 and 168 extending beyond two sides thereof. Posts 166 and 168 may be formed by a continuous cylindrical member disposed at one end of cover 164 or may be physically integral to cover 164. Post 166 extends further away from cover 164 than post 168 in order to accommodate a spring 170. Spring 170 is disposed between the two covers 164 so that both covers are spring biased by a single spring. Each cover 164 includes a groove 172 at one side thereof. Spring 170 includes a pair of coils 174, one for each cover 164. Coils 174 are disposed about corresponding post 166. Fingers 176 extend from coils 174 and are disposed within corresponding grooves 172. Spring 170 further includes a central tab 178 between coils 174. The spring 170 is free to rotate about the center axis of coils 174. Since the spring 170 is free to rotate, covers 164 may be located and snapped into place without preloading or other special operations. Once covers 164 are properly located with respect to the spring fingers 176 and snapped into place, the spring force is applied on the covers or doors 164 by the insertion of circuit board assembly 14 such that the tab 178 is located in a fixed downward attitude. Alternatively, the spring force may also be activated by rotating the center tab until it snaps into a receptacle in the housing (now shown).

Referring now to FIGS. 9A-E, an alternate embodiment of the circuit board is shown at 78'. Board 78' is a multilayer printed circuit board having a plurality of vias of feed-through holes therethrough. A first set of pads 180 having feed-through holes accepts block 86, a second set pads 182 having holes accepts block 84, a third set of pads 184 having holes accepts jack 90 and a fourth set of pads 186 having holes accepts jack 88. Surfaces 188 and 190 of board 78' include a plurality of circuit traces 192 interconnecting pads 182 with pads 186 and pads 180 with pads 184 in a predetermined configuration, thereby providing interconnection of block 84 with jack 88 and block 86 with jack 90. The configuration of the traces is determined by the application of the device, and generally conforms with a selected industry standard A first inner layer 192 of circuitry includes holes 194 and 196 which correspond to the holes associated with pads 180 and 182 respectively. Further, fifth and sixth sets of pads 197 and 198 having associated holes which correspond to the holes of pads 184 and 186 respectively. Layer 192 further includes a plurality of individual pad or plate elements 200 each of which function as a first plate of a capacitive element.

A second inner layer 204 of circuitry includes holes 206 and 208 which correspond to the holes associated with pads 180 and 182 respectively. Further, seventh and eighth sets of pads 210 and 212 having associated holes which correspond to the holes of pads 184 and 186 respectively. Layer 204 further includes a plurality of individual pad or plate elements 214 each of which function as a second plate of a capacitive element.

Circuit board 78' is comprised of a dielectric material whereby the plates 200 and 214 are aligned with the dielectric material therebetween defining individual capacitors. It will be appreciated that individual plates may be grouped together to define different capacitive values. These plates 200, 214 and thereby, the capacitors are interconnected with pads 197, 198, 210 and 212 by traces 216 on layers 192 and 204, whereby a capacitor is connected between corresponding leads of lacks 88 and 90. Again the capacitors are connected in a predetermined configuration, which is determined by the application of the device, and generally conforms with a selected industry standard. These capacitors are an important feature of the present invention and balance the reactance of the electrical components connected therein, whereby this connection device meets or exceeds the Category 5 requirements described hereinbefore.

Referring to FIGS. 10A-B the NEXT performance for the present invention is compared to a prior art device. FIG. 10A shows the NEXT performance of the present invention in accordance with the preferred embodiment. Plotted lines 220 indicate measured NEXT values. A line 222 indicates the minimum acceptable NEXT value for Category 3. A line 224 indicates the minimum acceptable NEXT value for Category 4. A line 226 indicates the minimum acceptable NEXT value for Category 5. FIG. 10B shows the NEXT performance of the prior art AMP ACO Category 5 device. Plotted lines 228 indicate measured NEXT values. A comparison of these plots clearly shows that the present invention provides superior performance over the prior art.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A panel yoke comprising:
    plate means having front and back opposing surfaces, a portion of said front surface being angled outwardly from the remainder of said front surface to define an aperture therebetween:
    securing means for snaplockedly securing said panel yoke to a panel, said securing means depending from said plate means;
    first connector means disposed within said panel yoke and aligned with said aperture for providing a gravity feed thereto, said first connector means being accessible at said front surface of said plate means;
    second connector means disposed on said panel yoke and being accessible at said back surface of said plate means; and
    a circuit board having said first and second connector means mounted thereto with circuitry on said circuit board interconnecting said first and second connector means.

2. The panel yoke of claim 1 wherein said first connector means comprises a modular jack.

3. The panel yoke of claim 1 further comprising: a plurality of tabs extending outwardly from said circuit board; and
    first and second opposing side panels extending from said back surface of said plate means, said first and second side panels having a plurality of channels therein, said tabs being received with in said channels.

4. The panel yoke of claim 3 wherein:
    said plate means includes a plurality of slots through said first and second sides within said channels, said tabs being received in said slots.

5. The panel yoke of claim 4 wherein:
    a pair of said slots being formed to define resilient panels for engaging a corresponding pair of said tabs of said circuit board.

6. The panel yoke of claim 1 further comprising:
    door means pivotably disposed on said plate means at said aperture, said door means including a closed position precluding access to said first connector means and an open position providing access to said first connector means.

7. The panel yoke of claim 6 wherein said door means is spring biased in said closed position.

8. The panel yoke of claim 1 further comprising:
    rear cover means attached to said plate means for covering said circuitry on said circuit board termination block.

9. The panel yoke of claim 1 wherein said plate means further includes:
    a portion of said front surface angled inwardly from said front surface, said portion angled inwardly aligned with said portion angled outwardly, wherein said aperture is defined between said portion angled inwardly and said portion angled outwardly.

10. The panel yoke of claim 1 wherein said second connector means comprises a termination block.

11. The panel yoke of claim 1 wherein said circuitry is configured on said circuit board to restore electrical balance between said first and second connector means.

12. The panel yoke of claim 11 wherein said circuitry includes:
a plurality of conductive through holes arranged and interconnected for restoring electrical balance between said first and second connector means, said through holes connected to said first and second connector means.

13. The panel yoke of claim 12 wherein said conductive through holes provide reactance for restoring electrical balance between said first and second connector means.

14. The panel yoke of claim 12 wherein said conductive through holes provide capacitance for restoring electrical balance between said first and second connector means.

15. The panel yoke of claim 1 wherein:
said second connector means is disposed at an angle of other than 180 degrees with respect to said aperture.

16. A panel yoke comprising:
plate means having front and back opposing surfaces, a portion of said front surface being angled outwardly from the remainder of said front surface To define an aperture therebetween;
securing means for snaplockedly securing said panel yoke to a panel said securing means depending from said plate means:
a circuit board having circuitry thereon mounted to said plate means;
a modular jack disposed on said circuit board and aligned with said aperture for providing a gravity feed thereto; and
at least one a termination block disposed on said circuit board and connected by said circuitry to said modular jack.

17. The panel yoke of claim 16 further comprising: a plurality of tabs extending outwardly from said circuit board; and
first and second opposing side panels extending from said back surface of said plate means, said first and second side panels having a plurality of channels therein, said tabs being received with in said channels.

18. The panel yoke of claim 17 wherein:
said plate means includes a plurality of slots through said first and second sides within said channels, said tabs being received in said slots.

19. The panel yoke of claim 18 wherein:
a pair of said slots being formed to define resilient panels for engaging a corresponding pair of said tabs of said circuit board.

20. The panel yoke of claim 16 further comprising:
door means pivotably disposed on said plate means at said aperture, said door means including a closed position precluding access to said first connector means and an open position providing access to said modular jack.

21. The panel yoke of claim 20 wherein said door means is spring biased in said closed position.

22. The panel yoke of claim 16 further comprising: rear cover means attached to said plate means for covering said circuitry on said circuit board.

23. The panel yoke of claim 16 wherein:
said circuitry is configured on said circuit board to restore electrical balance between said modular jack and said termination block.

24. The panel yoke of claim 16 wherein:
said termination block is disposed at an angle of other than 180 degrees with respect to said aperture.

25. The panel yoke of claim 16 wherein:
said circuit board is mounted in said panel yoke at an angle of other than 180 degrees with respect to said aperture.

26. The panel yoke of claim 16 wherein said plate means further includes:
a portion of said front surface angled inwardly from said from surface, said portion angled inwardly aligned with said portion angled outwardly, wherein said aperture is defined between said portion angled inwardly and said portion angled outwardly.

27. The panel yoke of claim 23 wherein said circuitry includes:
a plurality of conductive through holes arranged and interconnected for restoring electrical balance between said modular jack and said termination block, said through holes connected to said modular jack and said termination block.

28. The panel yoke of claim 27 wherein said conductive through holes provide reactance for restoring electrical balance between said modular jack and said termination block.

29. The panel yoke of claim 27 wherein said conductive through holes provide capacitance for restoring electrical balance between said modular jack and said termination block.

30. A connector device comprising:
plate means having front and back opposing surfaces, a portion of said front surface being angled outwardly from the remainder of said front surface to define an aperture therebetween;
a circuit board having circuitry thereon mounted to said plate means, said circuit board being mounted to said plate means at an angle of other than 180 degrees with respect to said aperture;
a modular jack disposed on said circuit board and aligned with said aperture for providing a gravity feed thereto;
a termination block disposed on said circuit board and connected by said circuitry to said modular jack.

31. A connector device comprising:
plate means having front and back opposing surfaces, a portion of said front surface being angled outwardly from the remainder of said front surface to define an aperture therebetween
a circuit board having circuitry thereon mounted to said plate means;
a modular jack disposed on said circuit board and aligned with said aperture for providing a gravity feed thereto; and
at least one termination block disposed on said circuit board and connected by said circuitry to said modular jack, said termination block being disposed at an angle of other than 180 degrees with respect to said aperture.

* * * * *